United States Patent
Krassnitzer

(10) Patent No.: US 9,540,726 B2
(45) Date of Patent: Jan. 10, 2017

(54) DRILL HAVING A COATING

(71) Applicant: Oerlikon Trading AG, Trubbach, Trubbach (CH)

(72) Inventor: Siegfried Krassnitzer, Feldkirch (AT)

(73) Assignee: OERLIKON SURFACE SOLUTIONS AG, PFAFFIKON, Pfaffikon SZ (CH)

( * ) Notice: Subject to any disclaimer, the term of this patent is extended or adjusted under 35 U.S.C. 154(b) by 201 days.

(21) Appl. No.: 14/352,872

(22) PCT Filed: Oct. 18, 2012

(86) PCT No.: PCT/EP2012/004352
§ 371 (c)(1),
(2) Date: Apr. 18, 2014

(87) PCT Pub. No.: WO2013/056831
PCT Pub. Date: Apr. 25, 2013

(65) Prior Publication Data
US 2014/0248100 A1  Sep. 4, 2014

(30) Foreign Application Priority Data

Oct. 21, 2011  (DE) .................. 10 2011 116 576

(51) Int. Cl.
*C23C 14/06* (2006.01)
*C23C 14/35* (2006.01)
(Continued)

(52) U.S. Cl.
CPC .............. *C23C 14/35* (2013.01); *B23G 5/06* (2013.01); *C23C 14/0635* (2013.01); *C23C 14/0641* (2013.01); *C23C 14/345* (2013.01); *C23C 14/3485* (2013.01); *C23C 14/3492* (2013.01); *C23C 14/352* (2013.01);
(Continued)

(58) Field of Classification Search
USPC  51/307, 309; 428/336, 698, 699; 204/192.1, 192.15, 192.16
See application file for complete search history.

(56) References Cited

U.S. PATENT DOCUMENTS

2008/0052922 A1* 3/2008 Balint .................. B23D 61/127
76/112
2008/0260478 A1* 10/2008 Hovsepian .............. C23C 30/00
407/119
(Continued)

FOREIGN PATENT DOCUMENTS

DE  10 2008 021912 A1  11/2009
DE  10 2011 018363 A1  10/2012
(Continued)

OTHER PUBLICATIONS

Bobzin et al "Mechanical properties and oxidation behaviour of (Al,Cr)N and (Al,Cr,Si)N coatings for cutting tools" Thin Solid Films 5117 (2008) p. 1251-1256.*
(Continued)

*Primary Examiner* — Archene Turner
(74) *Attorney, Agent, or Firm* — Pearne & Gordon LLP

(57) ABSTRACT

The present invention relates to a method for coating a substrate, preferably a drill, wherein at least one first HiPIMS layer is applied by means of a HiPIMS process. Preferably, at least one second layer is applied to the first HiPIMS layer by means of a coating process that does not contain a HiPIMS process.

26 Claims, 1 Drawing Sheet

(51) Int. Cl.

| | | |
|---|---|---|
| *C23C 14/34* | (2006.01) | |
| *C23C 14/54* | (2006.01) | |
| *C23C 16/27* | (2006.01) | |
| *C23C 16/50* | (2006.01) | |
| *C23C 28/04* | (2006.01) | |
| *C23C 30/00* | (2006.01) | |
| *H01J 37/34* | (2006.01) | |
| *B23G 5/06* | (2006.01) | |

(52) U.S. Cl.
CPC .......... *C23C 14/355* (2013.01); *C23C 14/54* (2013.01); *C23C 14/548* (2013.01); *C23C 16/276* (2013.01); *C23C 16/277* (2013.01); *C23C 16/278* (2013.01); *C23C 16/50* (2013.01); *C23C 28/044* (2013.01); *C23C 28/046* (2013.01); *C23C 28/048* (2013.01); *C23C 30/005* (2013.01); *H01J 37/3405* (2013.01); *H01J 37/3467* (2013.01); *B23B 2228/105* (2013.01); *B23G 2200/26* (2013.01); *Y10T 408/78* (2015.01); *Y10T 408/89* (2015.01)

(56) References Cited

U.S. PATENT DOCUMENTS

| | | | |
|---|---|---|---|
| 2008/0292812 A1 | 11/2008 | Ramm | |
| 2009/0068450 A1* | 3/2009 | Muenz | C23C 14/0641 204/192.15 |
| 2009/0075114 A1* | 3/2009 | Hovsepian | C23C 14/022 428/469 |
| 2009/0162153 A1* | 6/2009 | Myrtveit | C23C 30/005 204/192.1 |
| 2009/0200158 A1* | 8/2009 | Ehiasarian | C23C 14/352 204/192.12 |
| 2011/0220415 A1 | 9/2011 | Jin | |
| 2013/0101818 A1* | 4/2013 | Cha | B32B 15/01 428/697 |
| 2014/0061030 A1* | 3/2014 | Krassnitzer | C23C 14/352 204/192.12 |
| 2014/0127519 A1* | 5/2014 | Lechthaler | C23C 14/345 428/698 |

FOREIGN PATENT DOCUMENTS

| | | |
|---|---|---|
| EP | 2 072 637 A2 | 6/2009 |
| JP | 2011-189419 A | 9/2011 |
| WO | 2006/089753 A1 | 8/2006 |
| WO | 2012/143087 A1 | 10/2012 |
| WO | 2012/143110 A1 | 10/2012 |

OTHER PUBLICATIONS

Lugscheider et al "Investigations of mechanical and tribological properties of CrAlN+C thin coatings on cutting tools" Surface & Coatings Techn. 174-175 (2003) p. 681-686.*

"Entwicklungen von HIPIMS and HIPIMS+ Technology" Werkzeugtechnik vol. 115 dated Sep. 15, 2010.

Munz W-D et al. "Industrial applications of HIPIMS" Journal of Physics: Conference Sereis, Institute of Physics Publishing, vol. 100, No. part. 8 dated Mar. 1, 2008.

Hovsepian P EH et al. "Novel TialCN/VCN nanoscale mulilayer PVD coatings depositied by the combined high-power impulse magnetron sputtering/unbalenced magnetron sputtering (HIPIMS/UMB) technology", Vacuum, vol. 82, No. 11 dated Jun. 19, 2008.

International Search Report for PCT/EP2012/004352 dated Jun. 4, 2013.

* cited by examiner

DRILL HAVING A COATING

The present invention relates to a drill according to the preamble of patent claim 1, in particular to a tap drill or a micro drill, as well as to a coating method according to the preamble of patent claim 11 for the coating of components and tools, in particular the coating of drills.

Tap drills have mostly one tap point and an adjoining guiding area. A distinction is made between tap drills with a straight and those with helical-shaped grooves, with the latter differing among others by their helix angle.

Often, such tap drills are provided with a titanium nitride (TiN) coating or a titanium carbonitride (TiCN) coating by means of PVD. In the case of such tap drills coated in particular by means of classic magnetron sputtering, it is often necessary to grind the cutting surfaces after the coating again down to the bare metal. One of the causes for this could be that due to the coating, the sliding and friction properties are altered to have a detrimental effect, which could result in chip shapes that cause the tap drill to suffer problems.

In contrast, tap drills that are coated by means of heat vapor deposition with TiN or TiCN do not need re-sharpening. However, it is only with a great deal of effort that heat vapor will allow the number of items that are required for an economically viable operation of the coating to be coated.

The use of cathodic arc evaporation for coating the tap drills will also not yield the desired results, probably because the so-called splatters inherent to this kind of coating and embedded in the layers result in an unacceptable surface roughness. Here too, a time-consuming and cost-intensive grinding would thus be necessary after the coating.

The object of the present invention is therefore to provide a coated drill, in particular a tap drill, that can essentially be used after the coating without extensive re-grinding.

A re-grinding here is to be clearly distinguished from a relatively simple and low-cost brushing process with which for example the burs generated by the coating are to be removed.

According to the invention, the objective is achieved by a method according to claim 1. Accordingly, a hard material coating is applied to a tap drill by means of a HiPIMS process. HiPIMS is short for High Power Impulse Magnetron Sputtering and is a sputtering process in which high discharge current densities yield an increased degree of ionization of the sputtered material. According to the invention, such layers that are at least partly deposited by means of the method disclosed in DE102011018363 are particularly preferred. In this method, a very high degree of ionization of the sputtered material is achieved. The corresponding ions are accelerated towards the substrate due to a negative has applied to the latter and make for a very high density. Since the method described in DE102011018363, in which voltage sources are operated in a master-slave configuration, results in a very stable coating process, the layers that are thus generated are accordingly compact, with a very high adhesion homogeneous and provided with a low surface roughness.

Particularly good results are achieved when, as a HiPIMS layer, layers have been deposited from nitrides and/or carbides and/or oxides with at least one, preferably however two of the metals from the group consisting of chromium, titanium, aluminum and tungsten. In this case, it was even possible to do without a bonding layer placed between the drill body and the HiPIMS layer. This is presumably the consequence of the ions landing onto the drill body with a high velocity. The deposition of the nitrides, carbides or oxides can in this respect occur alternately or simultaneously. The increase of the service life of drills coated with an AlCrN HiPIMS layer is particularly impressive.

According to a further embodiment of the present invention, an amorphous carbon or DLC layer, that can be executed in particular as containing metal, can also be provided on the HiPIMS layer. The amorphous carbon or DLC layer (hereinafter called carboniferous layer), thanks to its good sliding properties, has the advantage of a lower friction on surfaces not corresponding to the cutting edges, which results in a lower wear-and-tear and thus to a further extension of the tap drill's service life. Due to the low surface roughness of the HiPIMS layer, the carboniferous layer lying above it also has a low roughness, in particular if care is taken that the carboniferous layer does not exceed a thickness of 5 µm. The entire layer system preferably has a thickness of between 0.1 µm and 10 µm.

A method for coating a drill, preferably a tap drill, has been disclosed with a drill body onto which a HiPIMS layer is applied by means of a HiPIMS process, preferably directly onto the drill body.

The coating is preferably applied with a total thickness of between 0.1 µm and 10 µm.

As a HiPIMS layer, at least one layer has been preferably deposited from nitrides and/or carbides and/or oxides with at least one, preferably however two of the metals from the group consisting of chromium, titanium, aluminum and tungsten.

Preferably, the method includes at least one coating step during which a DLC layer, preferably a metalliferous DLC layer, is applied onto the HiPIMS layer.

The metallic element that is used for the coating of the metalliferous DLC layer preferably matches a metallic element in the HiPIMS layer. The metal content in the DLC layer can decrease gradually towards the surface.

The aforementioned classical magnetron sputtering is often called conventional sputtering process or conventional sputtering, as it is in the framework of the present description, all these expressions have the same meaning. The English name also gives the abbreviation MS (magnetron sputtering), which also has the same meaning as the classical magnetron sputtering process and is used in this description.

In a similar manner, the aforementioned "so-called splatters embedded in the layers" and that are produced by using arc evaporation processes are often called, as they are also in the framework of the present description, droplets or macro-particles, which are very characteristic of arc layers.

Within the framework of the present description, heat vapor deposition means plasma-assisted vacuum evaporation processes during which an evaporation of the layer material takes place by using a plasma source for supplying heat under vacuum pressure. A low-voltage arc for example can in this respect be used as a plasma source. The layer material to be evaporated can be placed in a crucible that can for example be operated as an anode. These coatings, due to their low roughness and generally good layer quality, have become well established for the coating of tap drills. However, the process parameters are not always that easily controllable.

The selection of the material for a coating with the aim of improving the performance of tap drills is not always obvious. Additionally, the kind of coating process also plays an important role, since the coating process influences directly the structure of the deposited layer and hence its properties.

Tap drills with a TiCN coating for example exhibit a very high surface hardness and have proven generally more resistant by comparison with tap drills with a coating realized from other materials. This prevents in particular the formation of edge burs.

On the other hand, a TiN coating does not make it possible to achieve a comparable surface hardness, but a TiN coating generally constitutes a good choice for the protection of drills, since longer service lifetimes can be achieved in comparison with uncoated drills and higher speeds can be used.

To drill non-metallic base materials, for which drills with Ti-based coatings have proved non suitable, a CrN coating deposited by means of PVD could in some cases be good.

Coated tapping tools provide higher service lifetimes and afford a significant increase of the cutting data. Thanks to the hard material coating, the resistance to wear-and-tear of the tap drill improves considerably. The formation of cold shuts and built-up edges is prevented. Thanks to the strongly reduced friction and the better sliding behavior of the coated tools, the cutting force is reduced, the wear-and-tear on the cutting surfaces is lessened and the surface quality of the tapped threads is considerably improved.

In the specific case of tapping tools using tap drills by way of example, it has been shown in several tests that layers produced by means of plasma-assisted vacuum evaporation (hereinafter called vapor layer) generally result in higher service lifetimes as compared with coatings produced by means of classic magnetron sputtering or by means of arc evaporation. In the frame of the present invention, tap drills were coated with arc layers with various compositions and layer structures and their cutting capacity was tested. According to the results, nearly all tested arc layers were always inferior for this application as compared with the well-established TiN- and TiCN-based vapor layers, even after performing corresponding post-treatments to reduce the surface roughness of the arc layers. However, the tap drills with aluminum-chromium-nitride-based arc layers (after the post-treatment) showed an almost similar and equally good performance as the tap drills with TiN TiCN vapor coatings.

However, in order to achieve equivalent properties, especially in terms of density and hardness, as the AlCrN-based arc layers but with a better surface quality in order to avoid extensive post-treatments, and thus aim in one way or another for the advantages of the plasma-assisted vacuum evaporation technology, the HiPIMS technology was used according to the present invention for coating the tap drills.

According to the present invention, a comparable or even further increased cutting performance can be achieved by comparison with the layers produced by means of plasma-assisted vacuum evaporation if the drill, for example the tap drill, is coated with at least one HiPIMS layer, which is preferably applied directly onto the drill body.

This is the case in particular if the HiPIMS layer comprises a nitride and/or carbide, preferably if the HiPIMS layer includes at least one nitride layer and/or one carbide layer.

In particular, (Al,Cr)N HiPIMS layers with an aluminum concentration relative to the chromium in a ratio of approx. 70 to 30 in atomic percent proved very suitable in order to achieve comparable results or even better results (at least for tap drilling specific workpiece materials) as compared with the thus far well-established (Ti,C)N vapor layers. Additionally, due to the low roughness of the HiPIMS layers by comparison with the arc layers, it is possible, as already mentioned above, to forgo the expensive post-treatments that would otherwise be required or to use much cheaper and less intensive post-treatments.

The aforementioned layer variant according to the present invention, that contains a DLC layer or preferably a metal-liferous DLC layer that is applied onto the HiPIMS layer, can advantageously be produced by means of the above mentioned master-slave configuration.

The master-slave configuration can be better explained with the aid of FIGS. 1 and 2.

In order to better understand the advantage of the master-slave configuration in the production of this kind of layers, a process for coating tap drills with a coating consisting of 5 layers will be described hereinafter by way of example as follows: 1) (Al,Cr)N, 2) CrN, 3) CrCN, 4) Cr-DLC and 5) DLC. Wherein:
1) the (Al,Cr)N functional layer is deposited by means of a HiPIMS process,
2) and 3) the CrN interlayer and the CrCN interlayer are deposited either by means of the HiPIMS process or by means of conventional sputtering (hereinafter also referred to as MS, from the English term magnetron sputtering) or partly by means of the HiPIMS process and partly by means of MS,
4) the sliding layer of Cr-doped DLC is deposited by means of a combination of MS and PACVD methods (PACVD from the English expression: plasma assisted chemical vapor deposition treatment) or by means of a combination of HiPIMS and PACVD methods or partly by means of HiPIMS/PACVD methods and partly by means of MS/PACVVD methods, and
5) the run-in layer is deposited from DLC by means of the PACVD method.

Four Al targets and two Cr targets are placed into the coating chamber (vacuum chamber) in a manner electrically insulated from one another and they are powered during the coating process through a power supply unit that is configured as master-slave unit. It would however also be possible to use Al/Cr targets with a specific composition in order to achieve the desired layer structure. Such layers can be produced for example by a smelted-metallurgical or powder-metallurgical process.

Figure 1:
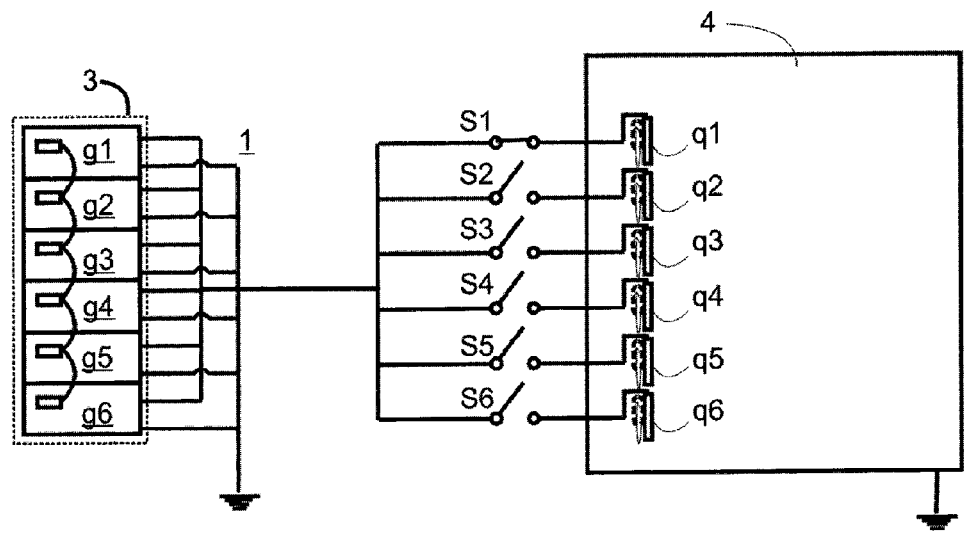
FIG. 1 shows a configuration with electrically insulated targets q1, q2, q3, q4, q5 and q6, which each have a moving magnet system, wherein the power supply unit consists of several generators g1, g2, g3, g4, g5 and g6, which are connected in the master-slave configuration.
Figure 2:
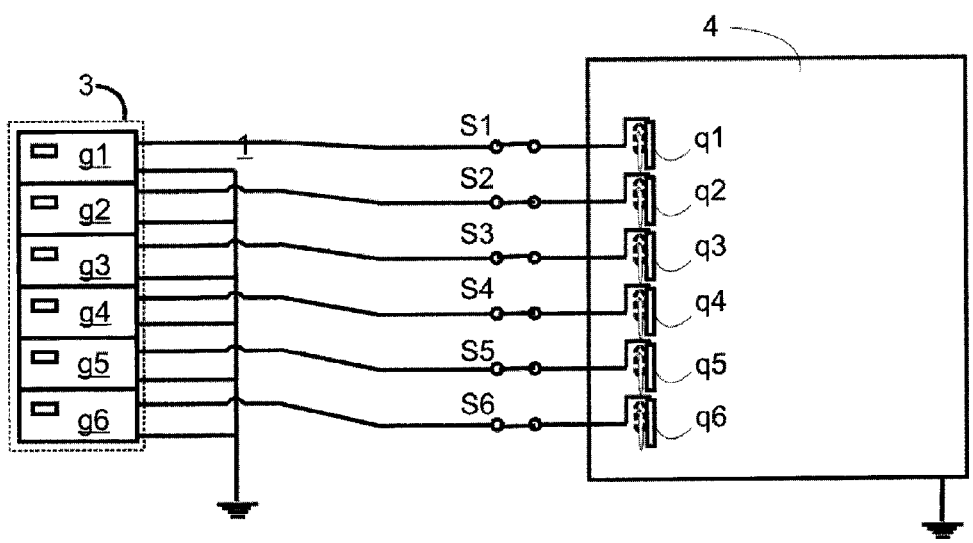
FIG. 2 shows a configuration with electrically insulated targets q1, q2, q3, q4, q5 and q6, which each have a moving magnet system, wherein the power supply unit consists of several generators g1, g2, g3, g4, g5 and g6, which are not connected in the master-slave configuration.

Master-slave configuration is understood as the parallel switching of the outputs of two or several generators, wherein the power to be set at one of the generators (the master) is chosen and the other generators are electronically connected in such a way that they follow the master in terms of their settings. Preferably, at least as many generators are switched together in the master-slave configuration as there are individual electrically insulated targets (see FIGS. 1 and 2).

The tap drills are first cleaned and/or, as required, the surface to be coated is pre-treated. Subsequently, the tap drills are placed in a corresponding substrate holder for their coating in the vacuum chamber. After the vacuum has been drawn in the vacuum chamber, the tap drills undergo a heating and an etching process. For the deposition of the HiPIMS (Al,Cr)N layer, the coating chamber is flooded with a gas mixture of argon and nitrogen. The corresponding gas flows are chosen such that the desired concentration ratio of argon to nitrogen as well as the desired total pressure are set. In order to achieve a higher degree of ionization, as is characteristic for the HiPIMS process, the increased output resulting from the combination is transferred to the individual targets, but only as long as the cooling of each target allows (in order to avoid melting or burning the target). The targets are switched on and off sequentially. The power supply unit in the master-slave configuration therefore never has to supply the full output simultaneously for all targets (see FIG. 1). In this manner, more cost-effective generators can be used for the HiPIMS deposition. As soon as the desired layer thickness of the (Al,Cr)N layer has been reached, the CrN interlayer is deposited. For this, the master-slave configuration is disassembled and each target thus has its own generator available (see FIG. 2). In this manner, it is possible to achieve a simple and swift switch from high-ionizing sputtering (HiPIMS) to conventional sputtering and vice-versa, if this is desired (by means of the switches S1, S2, S3, S4, S5 and S6, as shown for example in FIGS. 1 and 2). For the deposition of the CrN interlayer by means of conventional sputtering, only the two Cr targets are activated. In this case, the power at each of the Cr targets can be supplied without interruption by each corresponding generator, until the desired thickness of the CrN interlayer has been reached. The nitrogen concentration in the process as well as the total pressure can be freely adjusted before and/or during the deposition of the CrN layer in order to achieve the desired layer properties. For the deposition of the CrCN, a carboniferous reactive gas can be net into the coating chamber while the flows of the other process and reactive gases are adjusted. Here too, the concentration of the process and reactive gases as well as the power at the Cr targets can be freely adjusted before and/or during the deposition of the CrCN layer, in order to achieve the desired layer properties. Preferably, the concentration of nitrogen and the sputtering power at the Cr targets is reduced until the appropriate process conditions for the deposition of the Cr DLC layer are reached and a suitable has voltage has been set at the substrate for performing the PACVD method. After the Cr DLC layer has also reached the desired thickness, the DLC is deposited. For the deposition of the DLC run-in layer, the Cr targets are previously switched off either abruptly or gradually until no Cr arrives into the layer anymore and, if necessary, the concentration of the process and reactive gases as well as the pressure in the chamber and the bias voltage at the substrate are adjusted in order to achieve the desired layer properties.

During the deposition of every layer, a suitable bias voltage is preferably applied at the substrate and can also be freely adjusted during the deposition of each layer.

Coatings and coating methods according to the present invention can be particularly advantageous for increasing the cutting performance of micro drills, because layers with a high hardness yet simultaneously good sliding properties and especially a very low roughness are particularly in demand for the coating of micro drills, in order to avoid breakouts on the cutting edges. Furthermore, in the case of micro drills, post-treatments for reducing the layer roughness are particularly difficult, expensive and delicate to perform due to the very small dimensions, it would therefore be also advantageous to be able to apply such a coating according to the present invention that can provide a cutting performance comparable to that of an arc layer but with the low roughness of a MS layer. Furthermore, the HiPIMS layers according to the present invention are much better suited for the coating of micro drills compared to arc layers, because the deposition rate of these HiPIMS layers can be set so low that very thin layers as desired can be achieved and with great accuracy (for example layer thicknesses in the range of nanometers), and which are particularly advantageous because of the very small dimensions of the micro drills.

A further particular advantage of using the master-slave HiPIMS technology is the possibility of setting the impulse length and impulse power easily and at will during the coating process, which makes possible the deposition of HiPIMS layers with particularly increased quality and, depending on use, with layer properties that are freely adjusted reap, with an adapted layer structure and/or layer morphology.

What is claimed is:

1. Drill with a coating that is executed at least on the drill head of the drill and that has at least one HiPIMS layer that is applied directly onto the drill body of the drill, characterized in that the HiPIMS layer includes at least one layer of at least one nitride and/or carbide and/or oxide, and an amorphous carbon or DLC layer provided on the HiPIMS layer,
   wherein the amorphous carbon or the DLC layer, in the form of a metalliferous DLC layer, is provided on the HiPIMS layer, and
   the metal content in the DLC layer decreases gradually towards the surface.

2. Drill according to claim 1, characterized in that the HiPIMS layer includes at least one metal from the group consisting of chromium, titanium, aluminum and tungsten.

3. Drill according to claim 2, characterized in that the HiPIMS layer is a (Al,Cr)N layer.

4. Drill according to claim 2, wherein the HiPIMS layer includes two of the metals from the group consisting of chromium, titanium, aluminum and tungsten.

5. Drill according to claim 1, characterized in that the total thickness of the coating is between 0.1 µm and 10 µm.

6. Drill according to claim 1, characterized in that the drill is a micro drill and the total thickness of the coating is preferably between 0.01 µm and 5 µm.

7. Drill according to claim 1, wherein the drill comprises a tap drill.

8. Coating method for coating substrates, wherein at least one first and at least one second layer are deposited on at least one part of the substrate surface, characterized in that:
   the first layer is a HiPIMS layer that is applied by means of a HiPIMS process, preferably directly onto the substrate surface, and
   the second layer is applied by means of a coating method of another type, by means of at least one of conventional sputtering and a PACVD method and a combined MS/PACVD method onto the first layer,
   wherein the first layer includes at least one layer of at least one nitride and/or carbide and/or oxide, and an amorphous carbon or DLC layer provided on the HiPIMS layer.

9. Method according to claim 8, characterized in that the HiPIMS layer is deposited with at least one of one nitride and carbide and oxide, and the second layer is deposited with carbon.

10. Method according to claim 9, characterized in that the metalliferous DLC layer is deposited in such a way that the metal content in the DLC layer decreases gradually towards the surface and preferably a non-metalliferous DLC run-in layer is deposited as top layer onto the metalliferous DLC layer.

11. Method according to claim 9, characterized in that
the HiPIMS layer is deposited as a functional layer, preferably from (Al,Cr)N or with (Al,Cr)N, and
the second layer is deposited as sliding layer, preferably deposited by using a MS method or a combined MS/PACVD method, preferably from DLC containing chromium, and
between the HiPIMS layer and the second layer at least one interlayer is deposited, preferably from CrN and/or CrCN, and
preferably a non-metalliferous DLC run-in layer is applied as top layer onto the metalliferous DLC layer.

12. Method according to claim 11, wherein the HiPIMS layer is deposited with an aluminum concentration relative to the chromium in a ratio of approx. 70 Al to 30 Cr in atomic percent.

13. Method according to claim 11, wherein, between the HiPIMS layer and the second layer, at least two interlayers are deposited.

14. Substrate with a coating applied according to a method according to claim 9 on at least one part of the substrate surface.

15. Substrate according to claim 14, wherein the substrate comprises drill.

16. Substrate according to claim 14, wherein the substrate comprises tool or component.

17. Method according to claim 9, wherein the second layer is deposited as DLC or metalliferous DLC.

18. Method according to claim 8, characterized in that the HiPIMS layer is deposited with at least one metal from the group consisting of chromium, titanium, aluminum and tungsten.

19. Method according to claim 18, wherein the HiPIMS layer is deposited with two of the metals from the group consisting of chromium, titanium, aluminum and tungsten.

20. Method according to claim 18, wherein the HiPIMS layer is a layer containing (Al,Cr)N.

21. Method according to claim 9, characterized in that the metal that is used for depositing the metalliferous DLC layer matches a metal in the HiPIMS layer.

22. Drill with a coating that is executed at least on the drill head of the drill and that has at least one HiPIMS layer that is applied directly onto the drill body of the drill, characterized in that the HiPIMS layer includes at least one layer of at least one nitride and/or carbide and/or oxide, and an amorphous carbon or DLC layer provided on the HiPIMS layer,
wherein a metalliferous DLC layer, is provided on the HiPIMS layer,
at least one metallic element in the metalliferous DLC layer matches a metallic element in the HiPIMS layer, and
between the HiPIMS layer and the metalliferous DLC layer, at least one layer containing nitrogen and carbon is deposited, whose nitrogen content decreases gradually towards the surface.

23. Drill according to claim 22, wherein the total thickness of the coating is between 0.1 μm and 10 μm.

24. Drill according to claim 22, wherein the drill is a micro drill and the total thickness of the coating is preferably between 0.01 μm and 5 μm.

25. Drill according to claim 22, wherein the HiPIMS layer includes at least one metal from the group consisting of chromium, titanium, aluminum and tungsten.

26. Drill according to claim 25, wherein the HiPIMS layer is a (Al,Cr)N layer.

* * * * *